(12) United States Patent
Yoshihara et al.

(10) Patent No.: US 9,091,925 B2
(45) Date of Patent: Jul. 28, 2015

(54) METHOD FOR FORMING SILICON-CONTAINING RESIST UNDERLAYER FILM

(71) Applicant: SHIN-ETSU CHEMICAL CO., LTD., Tokyo (JP)

(72) Inventors: Takao Yoshihara, Jyoetsu (JP); Tsutomu Ogihara, Jyoetsu (JP); Motoaki Iwabuchi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 110 days.

(21) Appl. No.: 13/895,957

(22) Filed: May 16, 2013

(65) Prior Publication Data
US 2013/0337168 A1    Dec. 19, 2013

(30) Foreign Application Priority Data
Jun. 13, 2012   (JP) .................................. 2012-133993

(51) Int. Cl.
   *B05D 3/12*      (2006.01)
   *G03F 7/16*      (2006.01)
   *H01L 21/02*      (2006.01)
   *H01L 21/67*      (2006.01)

(52) U.S. Cl.
CPC .......... *G03F 7/162* (2013.01); *H01L 21/02304* (2013.01); *H01L 21/6715* (2013.01)

(58) Field of Classification Search
CPC ..................... H01L 21/6715; H01L 21/02304; G03F 7/162
USPC ........... 427/240, 425, 299; 438/780, 782, 758
See application file for complete search history.

(56) References Cited

U.S. PATENT DOCUMENTS

| | | | |
|---|---|---|---|
| 6,170,494 B1 * | 1/2001 | Marinaro et al. | 134/22.18 |
| 2007/0238300 A1 | 10/2007 | Ogihara et al. | |
| 2008/0026322 A1 | 1/2008 | Ogihara et al. | |
| 2013/0045601 A1 * | 2/2013 | Ogihara et al. | 438/694 |
| 2013/0273476 A1 * | 10/2013 | Minegishi et al. | 430/323 |

FOREIGN PATENT DOCUMENTS

| | | |
|---|---|---|
| JP | 2005-290503 A | 10/2005 |
| JP | A-2007-302873 | 11/2007 |
| JP | A-2008-019423 | 1/2008 |
| JP | 2008-036491 A | 2/2008 |
| JP | 2009-019093 A | 1/2009 |

OTHER PUBLICATIONS

May 19, 2015 Office Action issued in Japanese Application No. 2012-133993.

* cited by examiner

*Primary Examiner* — Kirsten Jolley
(74) *Attorney, Agent, or Firm* — Oliff PLC

(57) ABSTRACT

The invention provides a method for forming a silicon-containing resist underlayer film, the method for coating and forming a silicon-containing resist underlayer film by spin coating method comprising: feeding an aqueous alkaline solution in a pipe of an apparatus for coating and forming a film by spin coating method to clean therein; supplying a silicon-containing resist underlayer film composition via the pipe; and coating the silicon-containing resist underlayer film on a substrate to form a film. There can be provided a method for forming a silicon-containing resist underlayer film capable of reducing coating defects after forming a film by cleaning and removing a precipitate derived from silicon-containing resist underlayer film composition that precipitates and adheres in a pipe of an apparatus for coating and forming a film.

7 Claims, No Drawings

METHOD FOR FORMING SILICON-CONTAINING RESIST UNDERLAYER FILM

BACKGROUND OF THE INVENTION

1. Field of the Invention

The present invention relates to a method for forming a silicon-containing resist underlayer film by spin coating method.

2. Description of the Related Art

In LSIs, advanced integration and higher process speed have made growing demands for more micro pattern size. Lithography technology has achieved further fine patterning by introducing a shorter wavelength of a light source and a resist composition appropriately selected according thereto.

Even in case of finer patterning by using the same light source, finer patterning with a constant thickness of a photoresist film used (i.e. a smaller pattern width) can make an aspect ratio of a photoresist pattern after development higher, leading to pattern fall. To solve this technical problem, photoresist film thickness has been determined smaller in accordance with finer patterning, so that the aspect ratio of a photoresist pattern is set within a proper range.

A multilayer resist method is known to solve these problems. Specifically, this method is a method for interposing an underlayer film having an etching selectivity different from a resist upper layer film (a photoresist film) between the resist upper layer film and a substrate to be processed to pattern on the resist upper layer film, transferring the pattern on the underlayer film by dry etching with a upper resist pattern as a dry etching mask, and further transferring the pattern on the substrate to be processed by dry etching with the underlayer film as a dry etching mask.

A silicon-containing resist underlayer film composition, consisting of a resist underlayer film in a multilayer resist method, has been recently used as such, due to its excellent processing property, an easy film forming property, and an etching selectivity different from an upper layer resist (Patent Documents 1 and 2).

Meanwhile, the silicon-containing resist underlayer film composition is disadvantageous to polymer cleaning. In fact, once a polymer precipitates in a pipe of an apparatus for coating and forming a film, it is very hard to remove the polymer to clean therein by using a commonly-used thinner such as acetone, propylene glycol monomethyl ether acetate, propylene glycol monomethyl ether, and γ-butyrolactone, cyclohexanone, as opposed to an organic film composition containing no silicon such as a conventional photoresist.

This problem is derived from a silicon-containing polymer contained in a silicon-containing resist underlayer film composition, thereby causing a precipitate of the polymer to form an insoluble polymer substance (generally known as siloxane gel). The siloxane gel is so small that it can pass through a filter (diameter: approx. 20 nm) connected to a discharge pipe of an apparatus for coating and forming a silicon-containing film, and observed as a foreign object in a silicon-containing film formed on a substrate for manufacturing a semiconductor apparatus. Now that there are no effective methods for cleaning and removing the siloxane gel generated in a pipe, such methods are urgently required.

PRIOR ART DOCUMENT

Patent Document

Patent Document 1: Japanese Unexamined Patent Publication No. 2007-302873

Patent Document 2: Japanese Unexamined Patent Publication No. 2008-019423

SUMMARY OF THE INVENTION

The present invention was made to solve the problems mentioned above, and was intended to provide a method for forming a silicon-containing resist underlayer film capable of reducing coating defects after forming a film by cleaning and removing a precipitate (siloxane gel) derived from a silicon-containing resist underlayer film composition that precipitates and adheres in a pipe of an apparatus for coating and forming a film.

To solve the problems as mentioned above, the present invention provides a method for coating and forming a silicon-containing resist underlayer film by spin coating method, the method for forming a silicon-containing resist underlayer film comprising: feeding an aqueous alkaline solution in a pipe of an apparatus for coating and forming a film by spin coating method to clean therein; supplying a silicon-containing resist underlayer film composition via the pipe; and coating the silicon-containing resist underlayer film on a substrate to form a film.

The method for forming a silicon-containing resist underlayer film can clean and remove a precipitate derived from a silicon-containing resist underlayer film composition that precipitates and adheres in a pipe of an apparatus for coating and forming a film by cleaning with an aqueous alkaline solution. Thus, coating defects from the precipitate as a micro foreign object can be reduced. Consequently, a production yield can be improved without causing pattern abnormality.

It is preferable that an aqueous tetraalkylammonium hydroxide solution be used as the aqueous alkaline solution.

The aqueous tetraalkylammonium hydroxide solution can dissolve a precipitate derived from a silicon-containing resist underlayer film composition that precipitates and adheres in a pipe of an apparatus for coating and forming a film and can clean the pipe in a more effective manner.

The method for forming a silicon-containing resist underlayer film of the present invention, as mentioned above, can reduce coating defects as a micro foreign object from a precipitate derived from a silicon-containing resist underlayer film composition, and as a result, can improve a production yield without causing pattern abnormality.

DETAILED DESCRIPTION OF THE PREFERRED EMBODIMENTS

The present invention will be described in more detail.

As mentioned above, conventional normal cleaning steps fail to sufficiently clean and remove a precipitate derived from a silicon-containing resist underlayer film composition that precipitates and adheres in a pipe of an apparatus for coating and forming a film. Thus, when the silicon-containing resist underlayer film composition is connected to an apparatus for coating and forming a film to be fed as a new chemical after cleaning, a precipitate that adheres in the pipe of an apparatus for coating and forming a film is removed, thereby generating coating defects as a micro foreign object and resulting pattern abnormality, having a lower production yield. This represents there are no effective methods for cleaning and removing a precipitate derived from the silicon-containing resist underlayer film composition that is generated in a pipe.

Inventors of the present invention carried out an extensive investigation to find that an aqueous alkaline solution is effective in dissolving and removing a precipitate derived from a silicon-containing resist underlayer film composition that precipitates in a pipe of an apparatus for coating and forming a film as a cleaning liquid; and as a result, the present invention could be accomplished.

The present invention provides a method for coating and forming a silicon-containing resist underlayer film by spin coating method, the method for forming a silicon-containing resist underlayer film comprising: feeding an aqueous alkaline solution in a pipe of an apparatus for coating and forming a film by spin coating method to clean therein; supplying a silicon-containing resist underlayer film composition via the pipe; and coating the silicon-containing resist underlayer film on a substrate to form a film.

After the method for forming a silicon-containing resist underlayer film of the present invention cleans the pipe of an apparatus for coating and forming a film, coating defects can be reduced in a coating film formed after coating a silicon-containing resist underlayer film composition that is additionally connected and fed. Consequently, the production yield can be improved without causing pattern abnormality.

The present invention will be described in more detail.

In the present invention, an aqueous alkaline solution is fed in a pipe of an apparatus for coating and forming a film by spin coating method to clean therein. The apparatus for coating and forming a film is not particularly restricted to this invention, and CLEAN TRACK ACT12 from Tokyo Electron Limited can be used.

In the pipe of an apparatus for coating and forming a film, a precipitate derived from a silicon-containing resist underlayer film composition (siloxane gel) that was previously fed can be adhered. The precipitate in the pipe can be dissolved and removed by feeding an aqueous alkaline solution in the pipe. Accordingly, the pipe of an apparatus for coating and forming a film is effectively cleaned.

Preferable example of the aqueous alkaline solution includes an aqueous tetraalkylammonium hydroxide solution, specifically an aqueous tetramethylammonium hydroxide solution, an aqueous tetraethylammonium hydroxide solution, an aqueous tetrapropylammonium hydroxide solution, and an aqueous tetrabutylammonium hydroxide solution.

The concentration of the aqueous alkaline solution is preferably 0.01% by mass or more and 50% by mass or less, and more preferably 0.1% by mass or more and 30% by mass or less.

The pipe may be repeatedly cleaned with an aqueous alkaline solution several times.

Subsequently, a pipe for supplying a silicon-containing resist underlayer film composition is connected to the above cleaned apparatus, and the silicon-containing resist underlayer film composition is supplied via the cleaned pipe to coat the silicon-containing resist underlayer film on a substrate to form a film.

The silicon-containing resist underlayer film composition is not particularly restricted to the present invention, but illustrative example thereof includes a silicon-containing resist underlayer film composition for ArF and a silicon-containing resist underlayer film composition for KrF, e.g. those disclosed in Japanese Unexamined Patent Publications No. 2007-302873 and 2008-19423.

The method for forming a silicon-containing resist underlayer film of the present invention can reduce coating defects of a coating film on a minimum level by effectively cleaning the pipe of an apparatus for coating and forming a film before a silicon-containing resist underlayer film composition as a chemical is connected to the apparatus for coating and forming a film.

EXAMPLE

The present invention will be specifically described with reference to Examples, but it is not restricted thereto. CLEAN TRACK ACT12 from Tokyo Electron Limited was used as an apparatus for coating and forming a film, and a bright-field defect inspection device from KLA-Tencor Corporation was employed to measure coating defects and wet particles.

Example 1

A silicon-containing resist underlayer film composition was appropriately connected to an apparatus for coating and forming a film to form a film on a 300 mm bare wafer and measure the number of coating defects. After a pipe connected to the silicon-containing resist underlayer film composition was intentionally fed with a solvent that the silicon-containing resist underlayer film composition failed to dissolve, the polluted pipe was substituted with a mixed solvent of a propylene glycol monomethyl ether acetate and a propylene glycol methyl ether whose mixing ratio is 3:7, and the wet particles were measured in the solvent by using a 300 mm bare wafer.

After the polluted solvent in the pipe was all discharged, the pipe was filled with 2.38% by mass of an aqueous tetramethylammonium hydroxide solution and allowed to stand for 24 hours. Subsequently, the pipe was fed with 2.38% by mass of an aqueous tetramethylammonium hydroxide solution (3.79 L), and then fed with a mixed solvent of a propylene glycol monomethyl ether acetate and a propylene glycol methyl ether whose mixing ratio is 3:7 (3.79 L) to clean therein. The silicon-containing resist underlayer film composition was approximately reconnected to the same pipe to form a film on a 300 mm bare wafer and confirm the effect of cleaning.

The number of coating defects (0.12 micrometers or more), and the number of wet particles measured in the above Example 1 are shown in Table 1.

Example 2

Likewise, the effect of cleaning was confirmed by using the conditions and steps of Example 1, except that 25% by mass of an aqueous tetramethylammonium hydroxide solution was employed instead of 2.38% by mass of an aqueous tetramethylammonium hydroxide solution. The results are shown in table 1.

Example 3

Likewise, the effect of cleaning was confirmed by using the conditions and steps of Example 1, except that 2.38% by mass of an aqueous tetrabutylammonium hydroxide solution was employed instead of 2.38% by mass of an aqueous tetramethylammonium hydroxide solution. The results are shown in table 1.

Example 4

Likewise, the effect of cleaning was confirmed by using the conditions and steps of Example 1, except that 25% by mass of an aqueous tetrapropylammonium hydroxide solution was employed instead of 2.38% by mass of an aqueous tetramethylammonium hydroxide solution. The results are shown in table 1.

Comparative Example

A silicon-containing resist underlayer film composition was connected to a pipe by using the steps of Example 1 to form a film on a 300 mm bare wafer and measure coating defects. After the pipe was polluted by using the steps of Example 1, the pipe was further substituted with a mixed solvent of a propylene glycol monomethyl ether acetate and a propylene glycol methyl ether whose mixing ratio is 3:7 to measure wet particles in the solvent by using a 300 mm bare wafer. After being allowed to stand for 24 hours, the pipe was further fed with a mixed solvent of a propylene glycol monomethyl ether acetate and a propylene glycol methyl ether whose mixing ratio is 3:7 (3.79 L) to clean therein. The silicon-containing resist underlayer film composition was appropriately reconnected to the same pipe to form a film on a 300 mm bare wafer and confirm the effect of cleaning. The results are shown in table 1.

TABLE 1

|  | Coating defects (after first connecting resist underlayer film) | Wet particles (after polluting) | Coating defects (after cleaning and reconnecting) |
| --- | --- | --- | --- |
| Example 1 | 34 | 14221 | 26 |
| Example 2 | ↑ | ↑ | 30 |
| Example 3 | ↑ | ↑ | 29 |
| Example 4 | ↑ | ↑ | 31 |
| Comparative Example | 29 | 9021 | 1074 |

According to Table 1, pipe cleaning with the aqueous alkaline solutions of Examples 1 to 4 shows significant reduction in coating defects compared to Comparative Example, when a silicon-containing resist underlayer film composition is reconnected.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A method for forming a silicon-containing resist underlayer film comprising:
   feeding an aqueous alkaline solution in a pipe of an apparatus that is used for coating and forming a film by spin coating method to clean therein; and
   supplying a silicon-containing resist underlayer film composition via the pipe; and coating the silicon-containing resist underlayer film on a substrate by spin coating method to form a film.

2. The method for forming a silicon-containing resist underlayer film according to claim 1,
   wherein an aqueous tetraalkylammonium hydroxide solution is used as the aqueous alkaline solution.

3. The method for forming a silicon-containing resist underlayer film according to claim 1,
   wherein an aqueous tetrapropylammonium hydroxide solution is used as the aqueous alkaline solution.

4. The method for forming a silicon-containing resist underlayer film according to claim 1,
   wherein an aqueous tetrabutylammonium hydroxide solution is used as the aqueous alkaline solution.

5. The method for forming a silicon-containing resist underlayer film according to claim 1,
   wherein the aqueous alkaline solution is capable of dissolving a siloxane gel precipitate.

6. The method for forming a silicon-containing resist underlayer film according to claim 1,
   wherein a siloxane gel precipitate is adhered in the pipe at least prior to the feeding step.

7. The method for forming a silicon-containing resist underlayer film according to claim 6,
   wherein feeding the aqueous alkaline solution in the pipe of the apparatus dissolves the siloxane gel precipitate adhered in the pipe.

* * * * *